(12) United States Patent
Matsuda et al.

(10) Patent No.: US 10,998,668 B2
(45) Date of Patent: May 4, 2021

(54) CONNECTOR ASSEMBLY WITH A CASE THAT HAS A CONNECTION STOPPING PORTION THAT PREVENTS STOPPING CONTACT BETWEEN FIRST AND SECOND CONNECTORS

(71) Applicant: Sumitomo Wiring Systems, Ltd., Mie (JP)

(72) Inventors: Hidekazu Matsuda, Mie (JP); Yuichi Nakanishi, Mie (JP)

(73) Assignee: Sumitomo Wiring Systems, Ltd.

(*) Notice: Subject to any disclaimer, the term of this patent is extended or adjusted under 35 U.S.C. 154(b) by 0 days.

(21) Appl. No.: 16/713,591

(22) Filed: Dec. 13, 2019

(65) Prior Publication Data

US 2020/0203880 A1 Jun. 25, 2020

(30) Foreign Application Priority Data

Dec. 25, 2018 (JP) .............................. JP2018-241127

(51) Int. Cl.
| | |
|---|---|
| *H01R 13/516* | (2006.01) |
| *H01R 12/71* | (2011.01) |
| *H05K 5/00* | (2006.01) |
| *H01R 12/57* | (2011.01) |

(52) U.S. Cl.
CPC ......... *H01R 13/516* (2013.01); *H01R 12/716* (2013.01); *H05K 5/0069* (2013.01); *H01R 12/57* (2013.01)

(58) Field of Classification Search
CPC ..... H01R 13/516; H01R 12/716; H01R 12/57
See application file for complete search history.

(56) References Cited

U.S. PATENT DOCUMENTS

| 4,767,350 A | * | 8/1988 | Cooper ................ H01R 12/716 439/271 |
| 2019/0052005 A1 | * | 2/2019 | Hasegawa .............. H01R 12/91 |
| 2019/0229459 A1 | * | 7/2019 | Zhou .................... H01R 13/506 |
| 2020/0203880 A1 | * | 6/2020 | Matsuda ............... H01R 13/516 |

FOREIGN PATENT DOCUMENTS

JP 2016-004620 1/2016

* cited by examiner

*Primary Examiner* — Abdullah A Riyami
*Assistant Examiner* — Nader J Alhawamdeh
(74) *Attorney, Agent, or Firm* — Gerald E. Hespos; Michael J. Porco; Matthew T. Hespos

(57) ABSTRACT

A connector assembly (10) disclosed by this specification is provided with a male connector (first connector) (14) including a connector-side receptacle (24) and to be fixed to a printed body (fixing member) (12), a female connector (second connector) to be fit into the connector-side receptacle of the first connector, and a case configured to accommodate the fixing member. The connector-side receptacle has a first facing surface configured to face a second facing surface provided on the second connector in a connecting direction. The case includes a connection stopping portion configured to come into contact with a contact portion provided on the second connector. A connecting operation of the first connector and the second connector is stopped in a state where the first facing surface and the second facing surface are not in contact by the contact of the contact portion and the connection stopping portion.

5 Claims, 6 Drawing Sheets

CONNECTOR ASSEMBLY WITH A CASE THAT HAS A CONNECTION STOPPING PORTION THAT PREVENTS STOPPING CONTACT BETWEEN FIRST AND SECOND CONNECTORS

BACKGROUND

Field of the Invention

This specification relates to a connector assembly.

Related Art

Japanese Unexamined Patent Publication No. 2016-4620 discloses a vertical board connector having a connection surface substantially vertical to a plate surface of a board and includes a housing body in the form of a rectangular tube elongated in a width direction. The housing body has a bottom wall and a peripheral wall rising from the outer periphery of the bottom wall so that the inside of the housing body is open up as a fitting space. A mating housing is fit into the fitting space from above.

Generally, the connection surface of the board connector is provided on the bottom wall of the housing body. At the time of connecting the mating housing and the housing body, the mating housing is inserted into the fitting space and pushed until a connection surface of the mating housing contacts the connection surface of the bottom wall of the housing body so that the mating housing and the housing body are connected. At this time, the bottom wall is pushed by the mating housing. Thus, a load is applied to a fixing member (e.g. board) for fixing the board connector and the fixing member may be broken.

SUMMARY

A connector assembly disclosed in this specification is provided with a first connector including a connector-side receptacle and to be fixed to a fixing member, a second connector to be fit into the connector-side receptacle of the first connector, and a case configured to accommodate the fixing member, wherein the connector-side receptacle has a first facing surface configured to face a second facing surface provided on the second connector in a connecting direction, and the case includes a connection stopping portion configured to come into contact with a contact portion provided on the second connector, a connecting operation of the first connector and the second connector being stopped in a state where the first facing surface and the second facing surface are not in contact by the contact of the contact portion and the connection stopping portion.

Although the connecting operation of the first and second connectors is stopped by the contact of the contact portion of the second connector and the connection stopping portion of the case, the first and second facing surfaces are not in contact. Thus, a load at the time of connecting the first and second connectors is applied to the case. In this way, a load applied to the fixing member at the time of connection can be suppressed and the breakage of the fixing member due to the load at the time of connection can be suppressed.

Further, the case may include a case-side receptacle open in the connecting direction, the second connector may include a facing wall portion configured to face an opening edge of the case-side receptacle in the connecting direction when the first connector and the second connector are connected, and the contact portion may be provided on the facing wall portion of the second connector and the connection stopping portion may be provided on the opening edge of the case-side receptacle.

By providing the case with the case-side receptacle and providing the second connector with the facing wall portion configured to face the opening edge of the case-side receptacle, the contact portion can be set on the facing wall portion and the connection stopping portion can be set on the case-side receptacle.

The facing wall portion may be plate-like and provided on a rear end part of the second connector in the connecting direction.

By providing the facing wall portion on the rear end part of the second connector in the connecting direction, the facing wall portion can be easily pressed with fingers and workability in connecting the first and second connectors can be improved.

According to the connector assembly disclosed in this specification, the breakage of the fixing member due to a load applied at the time of connecting the first connector fixed to the fixing member and the second connector can be suppressed.

DETAILED DESCRIPTION

Embodiment

A connector assembly 10 of an embodiment is described with reference to FIGS. 1 to 6.

Figure 1:
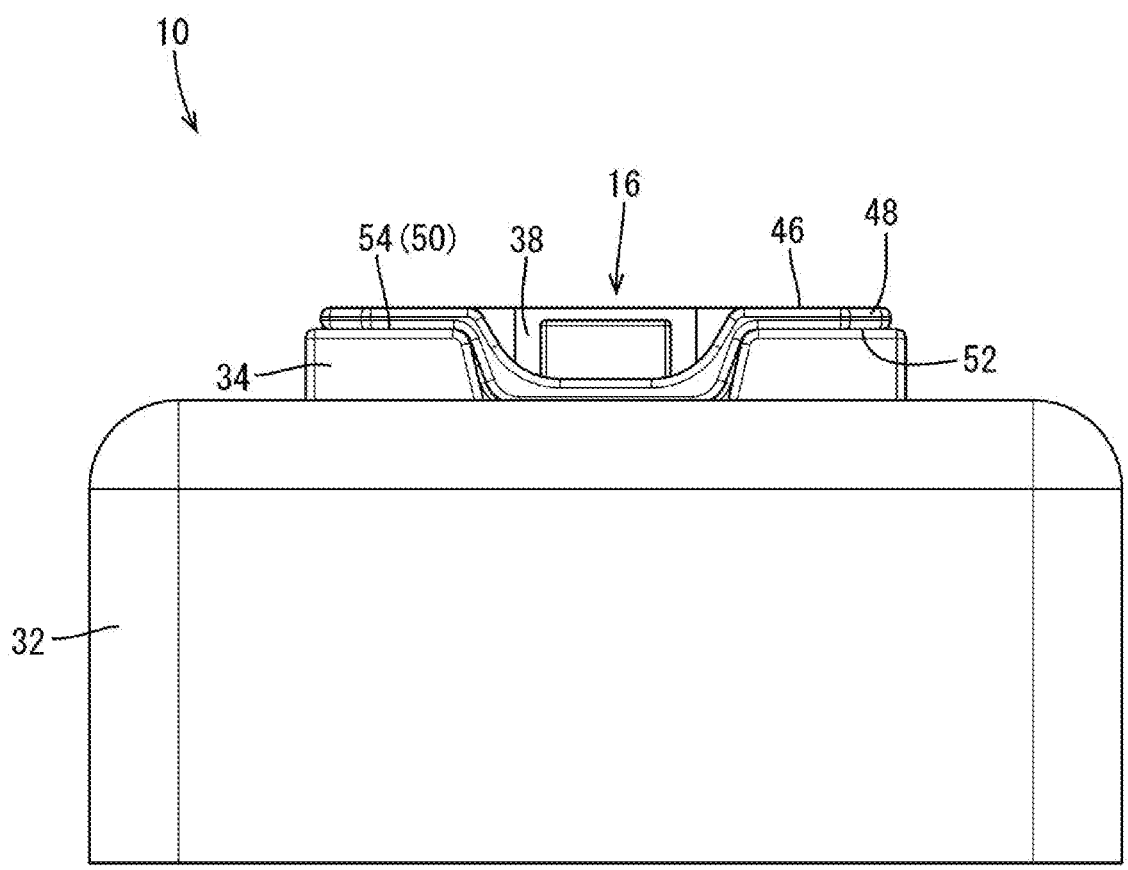
FIG. 1 is a side view of a connector assembly in an embodiment.
Figure 2:
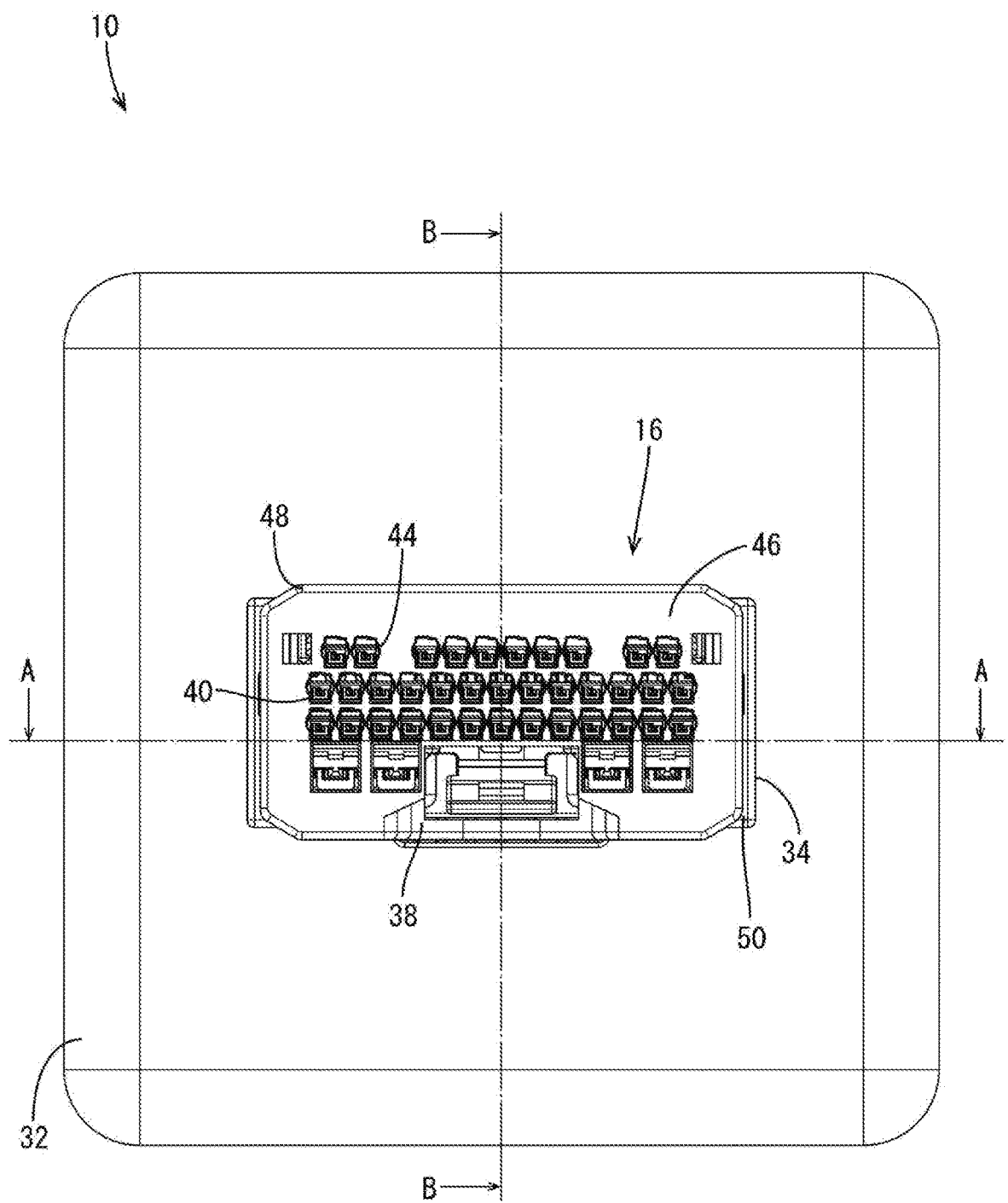
FIG. 2 is a plan view of the connector assembly.
Figure 3:
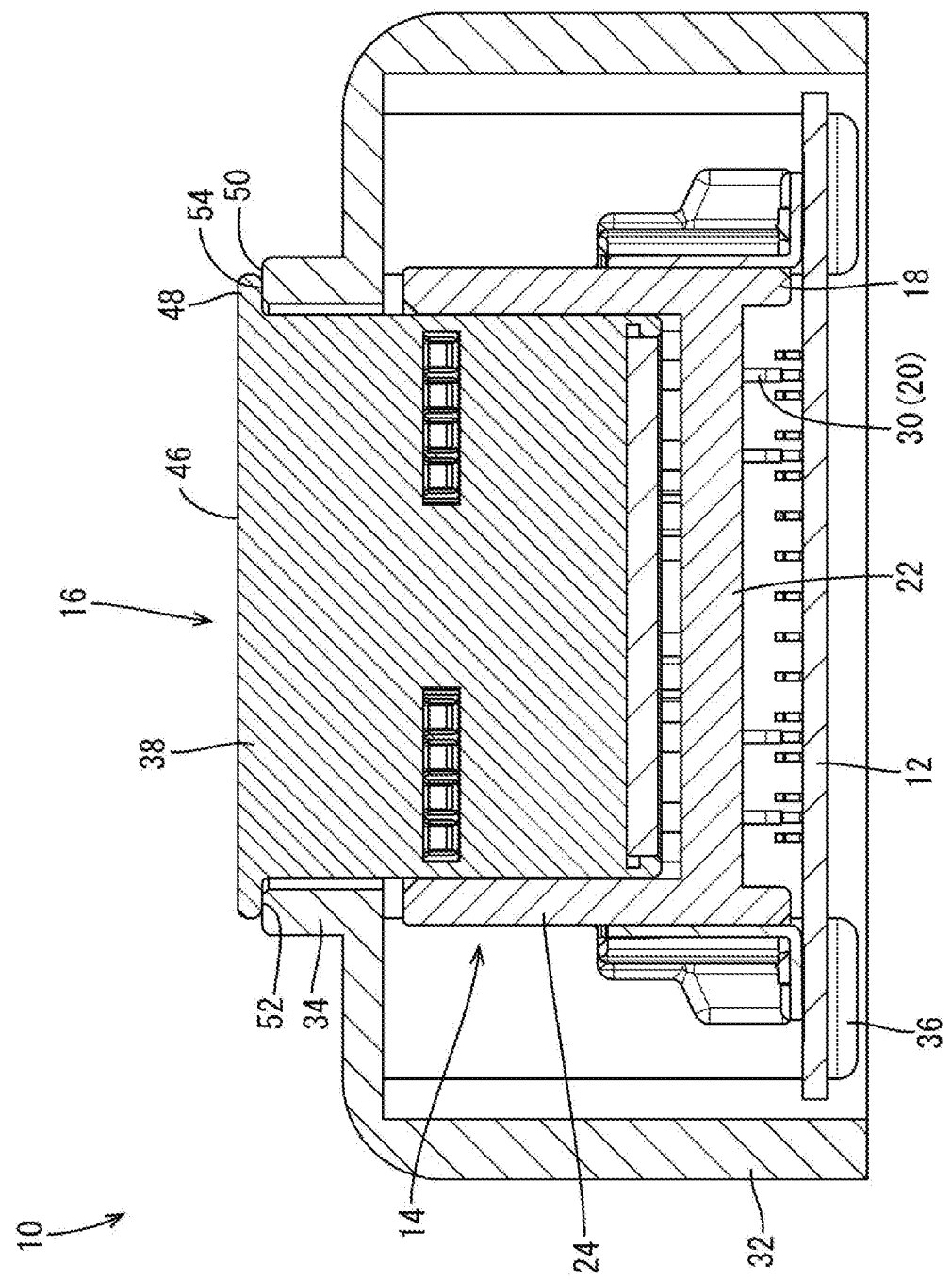
FIG. 3 is a section along A-A in FIG. 2.
Figure 4:
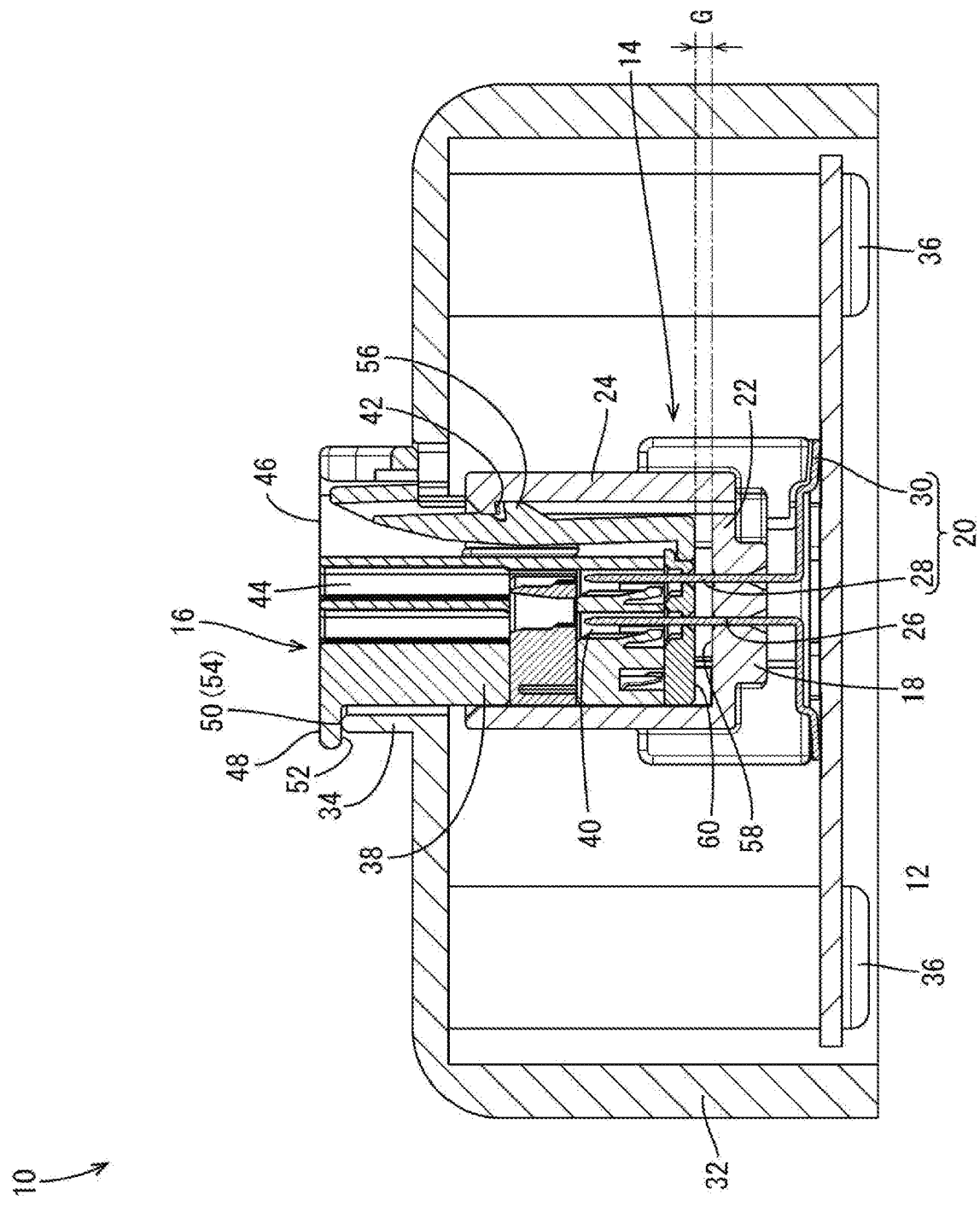
FIG. 4 is a section along B-B in FIG. 2.

The connector assembly 10 of this embodiment includes, as shown in FIGS. 3 and 4, a male connector (first connector) 14 to be soldered and fixed to a printed board (fixing member) 12, a female connector (second connector) 16 to be connected to the male connector 14 and a case 32 for accommodating the printed board 12 and the male connector 14. In the following description, an upper side in a vertical direction (connecting direction of the male connector 14 and the first connector 16) is based on a direction from a lower side toward an upper side of the plane of FIG. 1, a front side in a front-rear direction is based on a direction from a lower side toward an upper side of the plane of FIG. 2, and a right side in a lateral direction is based on a direction from a left side toward a right side of the plane of FIG. 2.

Figure 5:
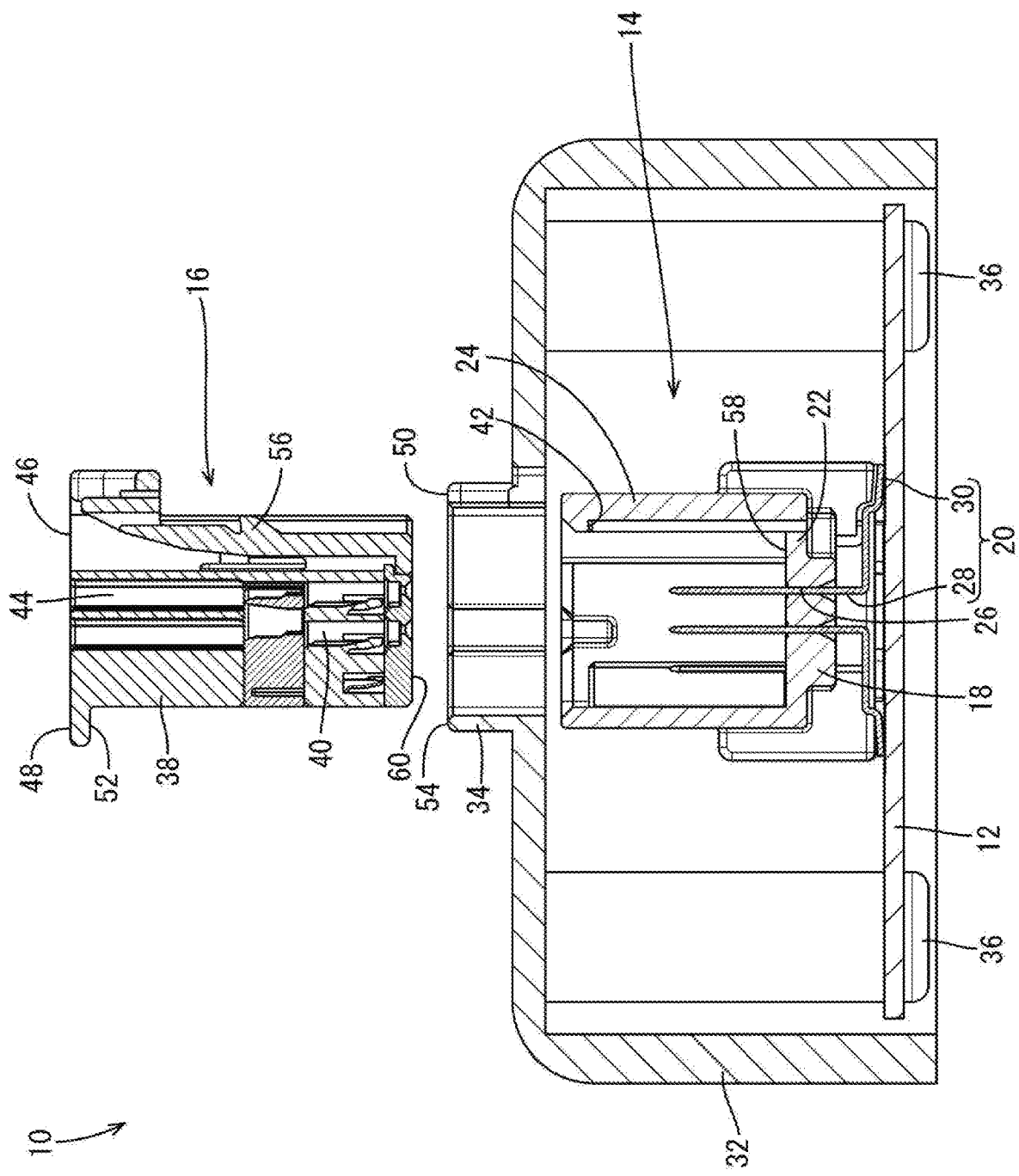
FIG. 5 is a section, corresponding to FIG. 4, in a state during connection.
Figure 6:
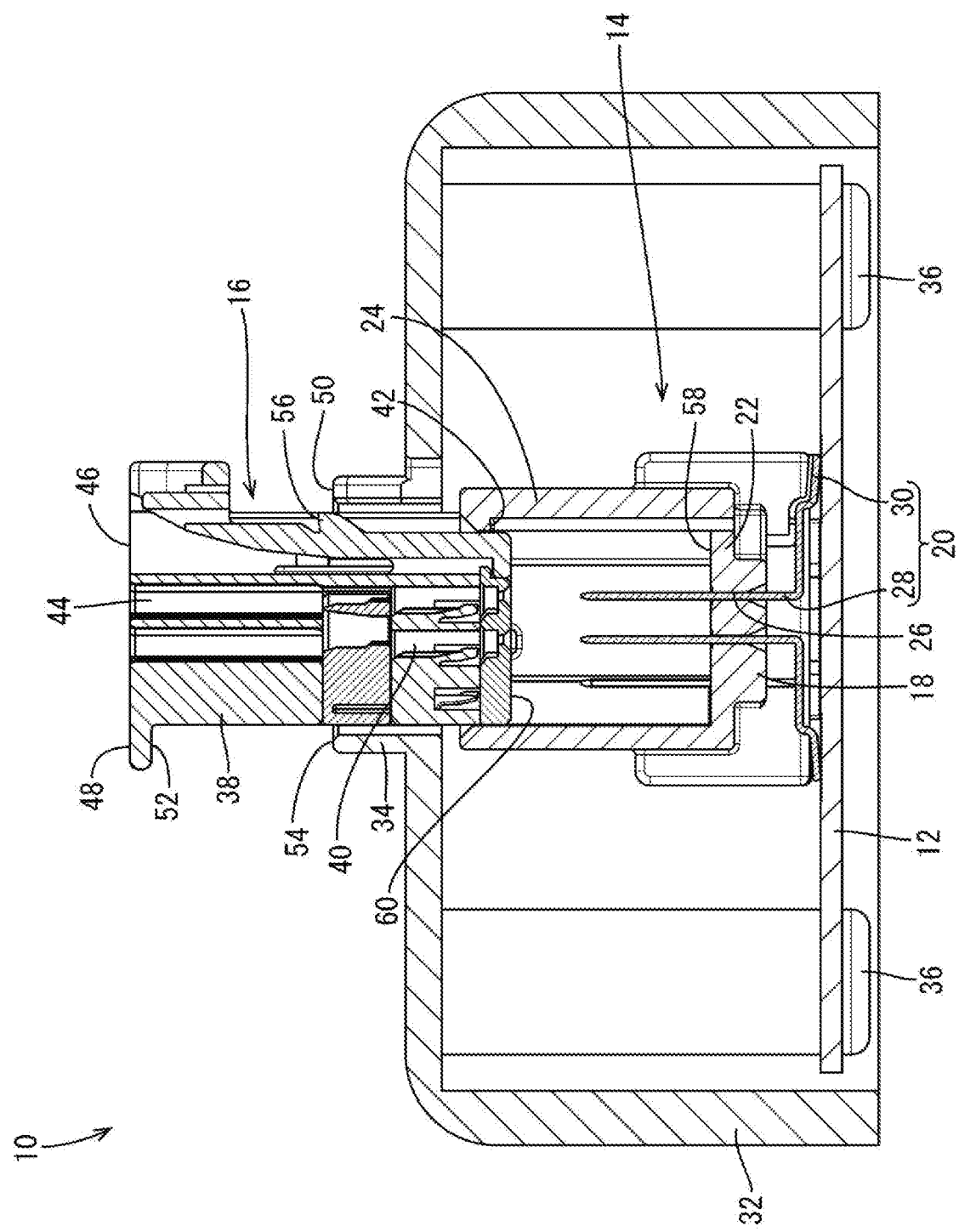
FIG. 6 is a section, corresponding to FIG. 4, in a state before connection.

The male connector 14 is an SMT (Surface Mount Technology) connector to be vertically mounted on a surface of the printed board 12 and includes, as shown in FIGS. 4 to 6, a male housing 18 made of synthetic resin and a plurality of male terminals 20 made of conductive metal.

As shown in FIG. 3, the male housing 18 includes a plate-like bottom wall portion 22 and a connector-side receptacle 24 open upward from a peripheral edge part of the bottom wall portion 22. As shown in FIG. 4, a plurality of insertion holes 26 into which the plurality of male terminals 20 are individually inserted are provided to be open in the bottom wall portion 22. A male-side lock portion 42 projecting inward is provided on the upper end of the connector-side receptacle 24.

The male terminal 20 is in the form of a bar long in the vertical direction and includes a male terminal body portion 28 to be inserted into the insertion hole 26 of the bottom wall portion 22 from below and a board connecting portion 30 connected to a lower end part of the male terminal body portion 28 and to be soldered and connected to a land of the printed board 12.

The case 32 is in the form of a rectangular box and, as shown in FIG. 3, a case-side receptacle 34 open upward is provided in the upper surface of the case 32. As shown in FIG. 5, the inside of the case-side receptacle 34 communicates with the inside of the case 32 and the connector-side receptacle 24 of the male connector 14 is located below the case-side receptacle 34. The printed board 12 is fixed in the case 32 by bolts 36. The female connector 16 is accommodated into the case 32 through an opening of the case-side receptacle 34 and fit into the connector-side receptacle 24 of the male connector 14.

As shown in FIG. 4, the female connector 16 is made of synthetic resin and includes a female housing 38 having a rectangular shape long in the vertical direction and a plurality of female terminals 40 made of conductive metal and to be respectively fit to the plurality of male terminals 20. A plurality of cavities 44 into which the female terminals 40 are individually accommodated are provided to penetrate through the female housing 38 in the vertical direction (i.e. connecting direction). The cavities 44 are open upward in a rear end part 46 of the housing 38.

The rear end part 46 of the female housing 38 is provided with a plate-like facing wall portion 48 as shown in FIG. 3. The facing wall portion 48 protrudes in a direction perpendicular to the connecting direction and, as shown in FIGS. 4 to 6, is provided to vertically face an opening edge 50 of the case-side receptacle 34 when the male connector 14 and the female connector 16 are connected. By providing the facing wall portion 48 on the rear end part 46 of the female connector 16, the facing wall portion 48 can be easily pressed with fingers and workability in connecting the female connector 16 to the male connector 14 can be improved.

As shown in FIG. 3, a contact portion 52 is provided on the lower surface of the facing wall portion 48 of the female housing 38, and a connection stopping portion 54 is provided on the opening edge 50 of the case-side receptacle 34. The contact portion 52 and the connection stopping portion 54 are in contact with each other with the male connector 14 and the female connector 16 connected.

As shown in FIG. 4, a female-side lock 56 projects out on the outer peripheral surface of the female housing 38. When the male connector 14 and the female connector 16 are connected, the female-side lock 56 is located to contact the male-side lock 42 from below. The contact of the female-side lock 56 with the male-side lock 42 from below prevents the escape of the female connector 16 from the male connector 14.

As shown in FIGS. 4 to 6, a first facing surface 58 is provided on the bottom wall 22 of the male housing 18 and a second facing surface 60 is provided on the female housing 38. The first and second facing surfaces 58, 60 are arranged to face each other in the vertical direction. As shown in FIG. 4, with the male connector 14 and the female connector 16 connected, the first and second facing surfaces 58, 60 are not in contact and a gap G is secured between the first and second facing surface 58, 60.

Next, functions of this embodiment are described.

As the female connector 16 is accommodated into the case-side receptacle 34 as shown in FIG. 5, the female connector 16 is inserted into the connector-side receptacle 24 of the male connector 14 located below the case-side receptacle 34 as shown in FIG. 6. If the female connector 16 is further fit into the connector-side receptacle 24 in a state shown in FIG. 6, the contact portion 52 provided on the facing wall portion 48 of the female connector 16 comes into contact with the connection stopping portion 54 provided on the opening edge 50 of the case-side receptacle 34 from above, whereby a connection stopped state shown in FIG. 4 is reached. In this way, a connecting operation of the male connector 14 and the female connector 16 is stopped. At this time, since the connecting operation is stopped in a state where the first facing surface 58 of the male connector 14 and the second facing surface 60 of the female connector 16 are not in contact, a load at the time of connecting the male connector 14 and the female connector 16 is applied to the case 32. Thus, a load applied to the printed board 12 at the time of connection can be suppressed and the breakage of the printed board 12 due to the load at the time of connection can be suppressed.

As described above, according to this embodiment, the connecting operation of the male connector (first connector) 14 and the female connector (second connector) 16 is stopped by the contact of the contact portion 52 of the female connector (second connector) 16 and the connection stopping portion 54 of the case 32. However, since the first and second facing surfaces 58, 60 are not in contact, a load at the time of connecting the male connector (first connector) 14 and the female connector (second connector) 16 is applied to the case 32. In this way, a load applied to the printed board (fixing member) 12 at the time of connection can be suppressed and the breakage of the printed board (fixing member) 12 due to the load at the time of connection can be suppressed.

Further, by providing the case 32 with the case-side receptacle 34 and providing the female connector (second connector) 16 with the facing wall portion 48 configured to face the opening edge 50 of the case-side receptacle 34, the contact portion 52 can be set on the facing wall portion 48 and the connection stopping portion 54 can be set on the case-side receptacle 34.

Further, by providing the facing wall portion 48 on the rear end part (rear end part in the connecting direction) 46 of the female connector (second connector) 16, the facing wall portion 48 can be easily pressed with fingers and workability in connecting the male connector (first connector) 14 and the female connector (second connector) 16 can be improved.

Other Embodiments

The technique disclosed by this specification is not limited to the above described and illustrated embodiment. For example, the following various modes are also included.

(1) Although the first connector is the male connector 14 and the second connector is the female connector 16 in the above embodiment, the first connector may be a female connector and the second connector may be a male connector.

(2) Although the fixing member to which the male connector 14 is fixed is the printed board 12 in the above embodiment, there is no limitation to the printed board. For example, the fixing member may be anything to which a connector can be fixed, such as a clamp made of resin.

(3) Although the connection stopping portion 54 is provided on the opening edge 50 of the case-side receptacle 34 of the case 32 in the above embodiment, a connection stopping portion may be, for example, provided to project upward from the upper surface of the case in addition to that on the case-side receptacle.

LIST OF REFERENCE SIGNS

10: connector assembly
12: board (fixing member)
14: male connector (first connector)
16: female connector (second connector)
24: connector-side receptacle
32: case
34: case-side receptacle
46: rear end part (rear end part in connecting direction)
48: facing wall portion
50: opening edge
52: contact portion
54: connection stopping portion
58: first facing surface
60: second facing surface

What is claimed is:

1. A connector assembly, comprising:
    a case having a case receptacle and a connection stopping portion at an entrance to the case receptacle
    a first connector fixed to a fixing member, the fixing member and the first connector being disposed in the case, the first connector having a connector-side receptacle aligned with the case receptacle, a first facing surface formed at an end of the connector-side receptacle remote from an entry to the connector-side receptacle; and
    a second connector to be fit into the connector-side receptacle of the first connector via the case receptacle, a front end of the second connector having a second facing surface facing toward the first facing surface in a connecting direction when the second connector is fit in the connector-side receptacle, and the second connector has a contact portion that contacts the connection stopping portion of the case receptacle to stop a connecting operation before the second facing surface contacts the first facing surface.

2. The connector assembly of claim 1, wherein:
    the second connector includes a facing wall portion configured to face an opening edge of the case-side receptacle in the connecting direction when the first connector and the second connector are connected; and
    the contact portion is provided on the facing wall portion of the second connector.

3. The connector assembly of claim 2, wherein the facing wall portion is plate-like and provided on a rear end part of the second connector in the connecting direction.

4. The connector assembly of claim 1, wherein the fixing member is a circuit board.

5. The connector assembly of claim 1, wherein the first connector is a male connector having male terminals projecting into the connector-side receptacle.

* * * * *